(12) United States Patent
Yasunobe

(10) Patent No.: US 12,339,584 B2
(45) Date of Patent: Jun. 24, 2025

(54) SUBSTRATE CONVEYANCE METHOD, SUBSTRATE CONVEYANCE APPARATUS, MOLDING METHOD, AND ARTICLE MANUFACTURING METHOD

(71) Applicant: CANON KABUSHIKI KAISHA, Tokyo (JP)

(72) Inventor: Osamu Yasunobe, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 275 days.

(21) Appl. No.: 17/938,277

(22) Filed: Oct. 5, 2022

(65) Prior Publication Data
US 2023/0112924 A1  Apr. 13, 2023

(30) Foreign Application Priority Data
Oct. 7, 2021 (JP) .................... 2021-165612

(51) Int. Cl.
| | |
|---|---|
| *G03F 7/00* | (2006.01) |
| *B25J 11/00* | (2006.01) |
| *B25J 15/00* | (2006.01) |
| *B29C 59/00* | (2006.01) |
| *H01L 21/677* | (2006.01) |

(52) U.S. Cl.
CPC ......... *G03F 7/0002* (2013.01); *B25J 11/0095* (2013.01); *B25J 15/0033* (2013.01); *B29C 59/002* (2013.01); *H01L 21/67742* (2013.01); *H01L 21/67745* (2013.01); *H01L 2221/68368* (2013.01)

(58) Field of Classification Search
CPC ................. G03F 7/0002; B29C 59/002; H01L 21/67742; H01L 21/67745; H01L 2221/68368; B25J 11/0095; B25J 15/0033
See application file for complete search history.

(56) References Cited

U.S. PATENT DOCUMENTS

2016/0016353 A1* 1/2016 Yamamoto ............ G03F 7/0002
425/150

FOREIGN PATENT DOCUMENTS

JP   2003092335 A  *  3/2003

\* cited by examiner

*Primary Examiner* — Jerzi H Moreno Hernandez
(74) *Attorney, Agent, or Firm* — Canon U.S.A., Inc. I.P. Division

(57) ABSTRACT

A method for conveying a substrate from a first to a second apparatus is provided. Material is applied to the substrate when on the first apparatus. A substrate conveyance apparatus including first and second holding portions is used. As a first step, the substrate is transferred from a first apparatus placement surface to the substrate conveyance apparatus. The substrate is then conveyed from the first apparatus to the second apparatus. The substrate is then transferred from the first holding portion to the second apparatus. In the first step, raising the first holding portion in a state where the first holding portion is inserted in a space under the substrate causes the first holding portion to hold the substrate, and the second holding portion to hold a protection member by holding a holding and receiving portion provided on a protection member surface opposite to a protection member surface facing the substrate.

11 Claims, 6 Drawing Sheets

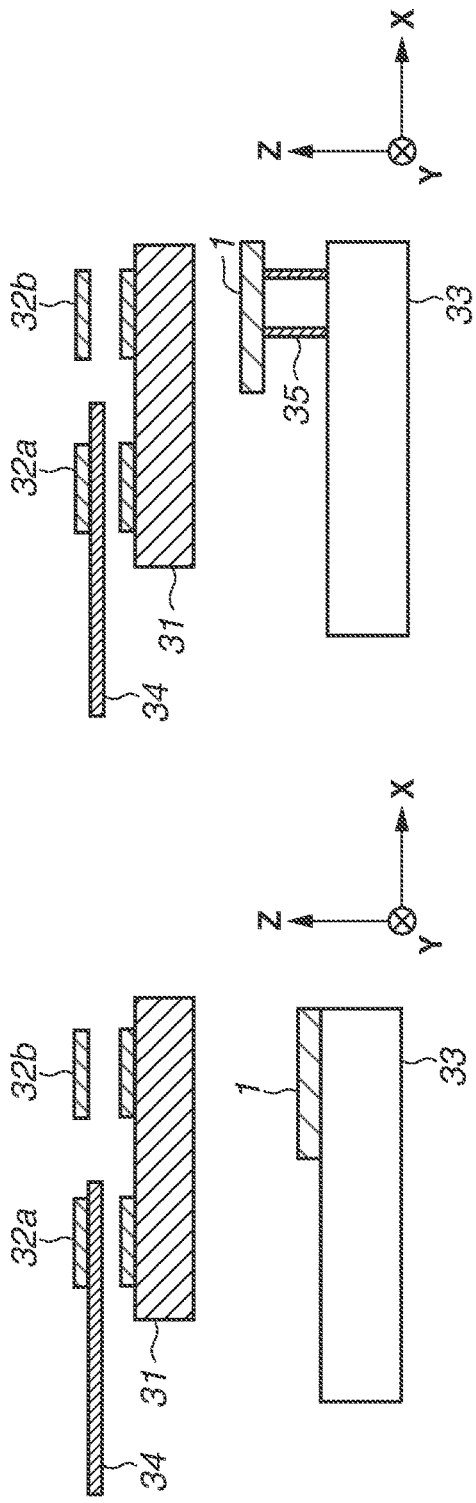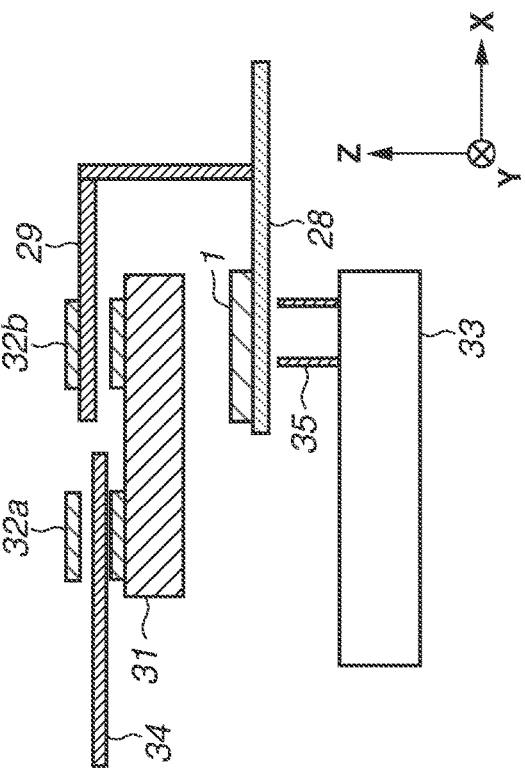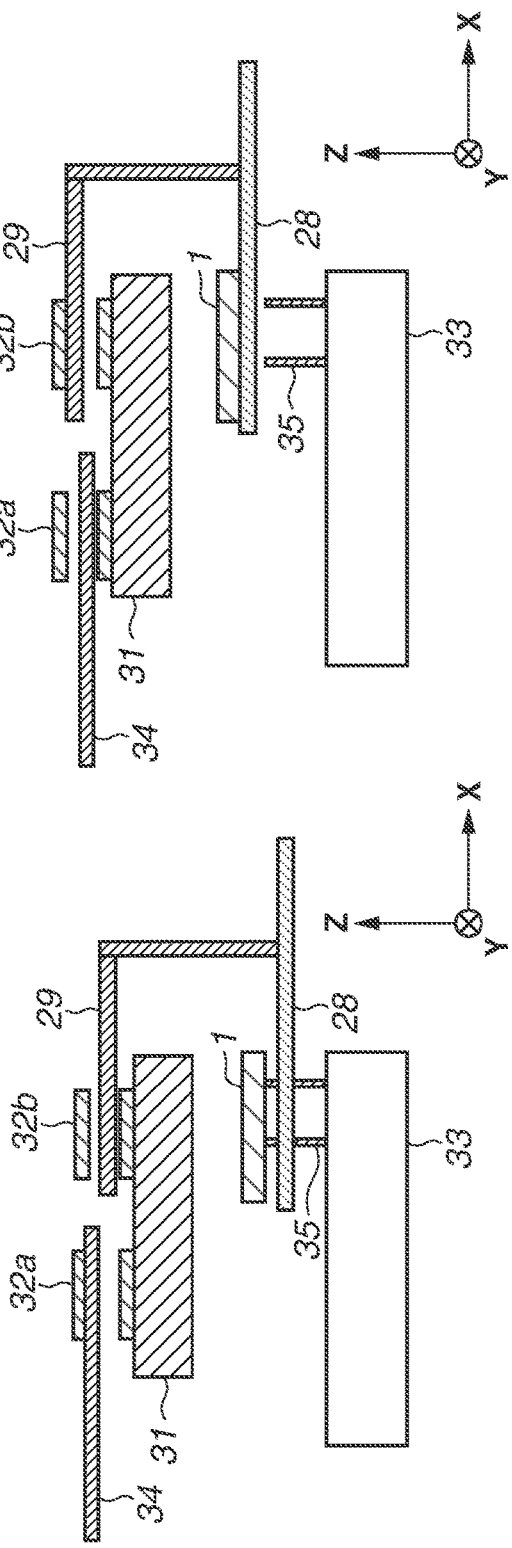

SUBSTRATE CONVEYANCE METHOD, SUBSTRATE CONVEYANCE APPARATUS, MOLDING METHOD, AND ARTICLE MANUFACTURING METHOD

BACKGROUND

Field

The present disclosure relates to a substrate conveyance method, a substrate conveyance apparatus, a molding method, and an article manufacturing method.

Description of the Related Art

There is known a molding apparatus for molding a material by bringing a substrate on which the material such as a curable composition is applied and a mold into contact with each other. Examples of such a molding apparatus include an imprint apparatus and a flattening apparatus. With the imprint apparatus, a pattern can be formed on a material applied on a substrate by using a mold having a corresponding pattern. With the flattening apparatus, a material applied on a substrate can be flattened by using a mold having a flat surface.

A step of applying a material to a substrate can be performed by an apparatus different from the above-described molding apparatus. In this case, a step of conveying the substrate after the material is applied to the substrate arises, and thus it takes time from when the material is applied to the substrate to when the molding is performed. Accordingly, for example, there is a possibility that flatness required in flattening treatment cannot be achieved due to evaporation of the material before the treatment of the material.

Further, in the step of conveying the substrate, foreign substances (particles) may possibly adhere onto the substrate. In a case where the material is molded in a state where foreign substances adhere to the substrate, there is a possibility that the required flatness cannot be achieved. It is undesirable for not only the above-described molding apparatus, but also all the lithography apparatuses including an exposure apparatus, that the material applied on the substrate evaporates or foreign substances adhere onto the substrate. Japanese Patent Application Laid-open No. 2003-92335 discusses a substrate conveyance apparatus including a dust adhesion prevention unit for covering an upper portion of the substrate, and discusses a method for reducing the adhesion of foreign substances to the substrate.

Japanese Patent Application Laid-open No. 2003-92335 discusses the dust adhesion prevention unit of a movable type, and driving the dust adhesion prevention unit at the time of transferring the substrate enables the transfer of the substrate. However, at the time of transferring the substrate, there is a possibility that a flow of air may be generated by driving the dust adhesion prevention unit, which may result in a situation where the material can evaporate.

SUMMARY

The present disclosure is directed to a substrate conveyance method advantageous in reducing evaporation of a material applied on a substrate.

According to an aspect of the present disclosure, a substrate conveyance method for conveying a substrate, which is placed on a first apparatus and on which a material is applied, to a second apparatus different from the first apparatus using a substrate conveyance apparatus including a first holding portion configured to hold the substrate and a second holding portion configured to hold a protection member for protecting an upper surface of the substrate, includes transferring, as a first step, the substrate from a placement surface of the first apparatus to the substrate conveyance apparatus, conveying, as a second step, the substrate from the first apparatus to the second apparatus, and transferring, as a third step, the substrate from the first holding portion to the second apparatus, wherein, in the first step, raising the first holding portion in a state where the first holding portion is inserted in a space under the substrate causes the first holding portion to hold the substrate, and causes the second holding portion to hold the protection member by holding a holding and receiving portion provided on a surface of the protection member opposite to a surface of the protection member facing the substrate.

Further features of the present disclosure will become apparent from the following description of exemplary embodiments with reference to the attached drawings.

BRIEF DESCRIPTION OF THE DRAWINGS

FIGS. 5A to 5D are diagrams illustrating steps of transferring a substrate.

DESCRIPTION OF THE EMBODIMENTS

Figure 1:
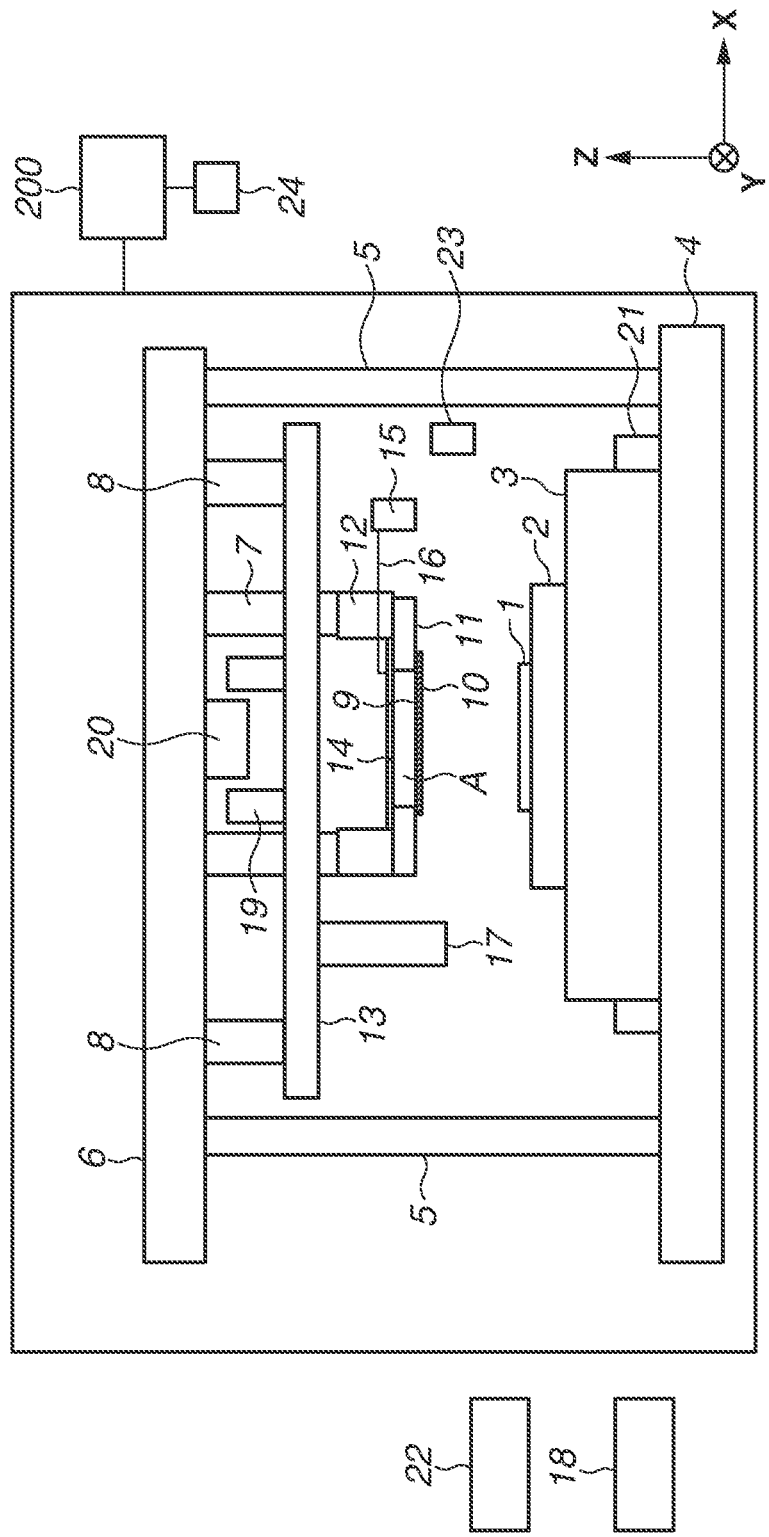
FIG. 1 is a diagram schematically illustrating a configuration of a flattening apparatus.

Exemplary embodiments of the present disclosure will be described below with reference to the attached drawings. In the drawings, the same reference numbers are assigned to the same components, and duplicate descriptions thereof will be omitted.

There is known a molding apparatus for molding a material by bringing a substrate on which the material such as a curable composition is applied and a template into contact with each other. Examples of such a molding apparatus include an imprint apparatus and a flattening apparatus. FIG. 1 schematically illustrates a configuration of a flattening apparatus 100 serving as a molding apparatus according to a first exemplary embodiment. In the present exemplary embodiment, a gravitational direction is defined as a Z axis direction, and a surface perpendicular to the Z axis direction is defined as an XY plane. In general, a substrate 1 that is an object to be processed is placed on a substrate stage 3 in such a manner that a surface of the substrate 1 is parallel to the XY plane.

A base pattern on the substrate 1 has an asperity profile resulting from a pattern formed in the previous step. In particular, with the recent advancement of multilayer structuring of memory elements, the substrate 1 to be processed may have about a 100 nm level difference. Due to influence of such an asperity profile, there is a possibility that the substrate 1 may be out of depth of focus (DOF) of an exposure apparatus. Conventionally, as a method for flattening the base pattern on the substrate 1, a method of forming a flattening layer using, for example, spin-on carbon (SOC) or chemical mechanical polishing (CMP) is used. However, under some circumstances, sufficient flatness cannot be obtained with the conventional technique, and the asperity difference of the base pattern tends to increase further in the future because of the advancement of the multilayer structuring.

A flattening apparatus locally flattens a surface of a substrate by bringing a template having a flat surface (a plane template) into contact with an uncured composition supplied to the substrate in advance. Then, in a state where the composition and the plane template are in contact with each other, the composition is cured and the plane template is separated from the cured composition. In this way, a flattening layer is formed on the substrate. The flattening apparatus is expected to have higher accuracy of flattening than the existing method because an amount of the composite corresponding to the level difference of the substrate is applied in drops.

The flattening apparatus 100 molds the composition on the substrate 1 using a template 9 serving as a pressing member. The flattening apparatus 100 cures the composition in a state where the template 9 is in contact with the material on the substrate 1, and forms the flattening layer of the material on the substrate 1 by separating the template 9 from the cured composition.

The substrate 1 can be, for example, a silicon wafer, but is not limited thereto. The substrate 1 can be formed of a desired material selected from among aluminum, titanium-tungsten alloy, aluminum-silicon alloy, aluminum-copper-silicon alloy, silicon oxide, silicon nitride, and the like. In addition, as the substrate 1, a substrate that is improved in adhesion to the composition by forming an adhesion layer thereon using surface treatment, such as silane coupling treatment, silazane treatment, or organic thin film forming treatment, may be used. The substrate 1 typically has a round shape with a diameter of 300 mm, but is not limited thereto.

The template 9 can be formed of a light-transmitting material considering a light irradiation step. Such a material can be, for example, glass, quartz, polymethyl methacrylate (PMMA), light-transmitting resin such as polycarbonate resin, a transparent metal evaporated film, a flexible film such as a polydimethylsiloxane film, a photo-curing film, or a metallic film. The template 9 desirably has a round shape with a diameter larger than 300 mm and smaller than 500 mm, but is not limited thereto. A thickness of the template 9 is desirably 0.25 mm or more and less than 2 mm, but is not limited thereto.

The composition can be a curable composition that is cured by being irradiated with light, for example, a ultraviolet (UV) curable liquid. As the UV curable liquid, a monomer liquid such as a acrylate liquid or a methacrylate liquid can be typically used. The curable composition can also be referred to as a moldable material. Hereinafter, the moldable material will also simply be referred to as a material.

A configuration of the flattening apparatus 100 will be described. As illustrated in FIG. 1, the flattening apparatus 100 includes a substrate chuck 2, the substrate stage 3, a base platen 4, supporting columns 5, a top plate 6, a guide bar 7, supporting columns 8, a template chuck 11, a head 12, and an alignment scope shelf 13. The flattening apparatus 100 further includes a pressure adjustment unit 15, a supply unit 17, an alignment scope 19, a light source 20, a stage drive unit 21, a cleaning unit 23, an input unit 24, and a control unit 200. The substrate chuck 2 and the substrate stage 3 can hold and move the substrate 1. The template chuck 11 and the head 12 can hold and move the template 9.

The substrate 1 is conveyed by a substrate conveyance apparatus 18 including a conveyance hand (a first holding portion), from an outside of the flattening apparatus 100 into the flattening apparatus 100, and is held by the substrate chuck 2.

The substrate stage 3 is supported by the base platen 4, and is driven in an X direction and a Y direction to align the substrate 1 held by the substrate chuck 2 with a predetermined position. The stage drive unit 21 includes, for example, a linear motor or an air cylinder to drive the substrate stage 3 in the XY plane. Alternatively, the stage drive unit 21 may have a function of driving the substrate stage 3 in two or more axis directions (e.g., six axis directions). Further, the stage drive unit 21 may include a rotation mechanism to rotate the substrate chuck 2 or the substrate stage 3 around the Z axis.

The template 9 serving as a pressing member is conveyed from the outside of the flattening apparatus 100 by a plate conveyance apparatus 22 including a conveyance hand, and is held by the template chuck 11. The template 9 has, for example, a round shape or a quadrangle shape, and has a first surface including a flat surface 10 to be brought into contact with the material arranged on the substrate 1, and a second surface that is on an opposite side of the first surface. In the present exemplary embodiment, a size of the flat surface 10 is equal to or larger than a size of the substrate 1. The template chuck 11 is supported by the head 12 and can have a function of correcting a position in a OZ direction (an inclination around the Z axis) of the template 9. The template chuck 11 and the head 12 each has an opening through which light (ultraviolet light) emitted from the light source 20 via a collimator lens passes. The template chuck 11 functions as a holding portion that mechanically holds the template 9. For example, the template chuck 11 holds the template 9 by attracting the second surface of the template 9 in a state where the second surface faces upward. The head 12 mechanically holds the template chuck 11. The template chuck 11 and the head 12 serve as a forming unit for performing flattening film forming processing. The head 12 includes a drive mechanism (not illustrated) for determining a distance between the substrate 1 and the template 9 at the time of bringing the template 9 into contact with the material on the substrate 1 and separating the template 9 from the material on the substrate 1, and moves the template 9 in a Z direction. The drive mechanism of the head 12 can include an actuator such as a linear motor, an air cylinder, or a vice coil motor. The template chuck 11 or the head 12 can be provided with a load cell for measuring a pressing force of the template 9 against the material on the substrate 1.

A plate deformation mechanism includes a sealing member 14 for making a space region A as a sealed space. The space region A is formed by an internal space surrounded by a space existing inside the template chuck 11 and by the template 9. The plate deformation mechanism further includes the pressure adjustment unit 15 provided outside the template chuck 11 to adjust pressure in the space region A. The sealing member 14 is formed of a light-transmitting flat plate member made of quartz glass or the like, and includes in a portion thereof a connection port (not illustrated) for a pipe 16 connected to the pressure adjustment unit 15. The pressure adjustment unit 15 can increase a deformation amount of the template 9 deforming toward the substrate 1 side in a protruding manner by increasing the pressure in the space region A. The pressure adjustment unit 15 can decrease a deformation amount of the template 9 deforming in a protruding manner by decreasing the pressure in the space region A. The base platen 4 is provided with the supporting columns 5 that support the top plate 6. The guide bar 7 is suspended by the top plate 6, passes through the alignment scope shelf 13, and is fixed to the head 12. The alignment scope shelf 13 is suspended by the top plate 6 via the supporting columns 8. The guide bar 7 passes through the alignment scope shelf 13. The alignment scope shelf 13 is provided with, for example, a height measurement system (not illustrated) for measuring a height (flatness) of the substrate 1 held by the substrate chuck 2, using an obliquely incident image shift method.

The alignment scope 19 includes an optical system and an imaging system for observing a reference mark provided on the substrate stage 3 and an alignment mark provided on the template 9. In a case where the alignment mark is not provided on the template 9, the alignment scope 19 may not necessarily be provided. The alignment scope 19 is used for an alignment operation that measures a relative position between the reference mark provided on the substrate stage 3 and the alignment mark provided on the template 9 and corrects a positional shift therebetween.

In the present exemplary embodiment, as described below, the substrate 1 is conveyed to the flattening apparatus 100 by the substrate conveyance apparatus 18 in a state where the material is applied on the substrate 1, and thus the supply unit 17 is not an essential component, but the supply unit 17 may be provided. The supply unit 17 includes a dispenser having a discharge port (a nozzle) for discharging the uncured material onto the substrate 1, and supplies (applies) the material onto the substrate 1.

The supply unit 17 employs, for example, a piezo-jet method or a micro-solenoid method, and can supply a material of minute volume of about one picoliter onto the substrate 1. The number of discharge ports in the supply unit 17 is not particularly limited, and may be one (a single nozzle may be used), or may be two or more (e.g., 100 or more). The supply unit 17 may include a linear nozzle array with one row of nozzles or a plurality of rows of nozzles. In the present exemplary embodiment, the substrate 1 on which the material is applied may be conveyed to the flattening apparatus 100, and the supply unit 17 may further apply the material onto the substrate 1.

The cleaning unit 23 cleans the template 9 in a state where the template 9 is held by the template chuck 11. In the present exemplary embodiment, the cleaning unit 23 removes the material adhering to the template 9, particularly, the material adhering to the flat surface 10 due to the separation of the template 9 from the cured material on the substrate 1. For example, the cleaning unit 23 may wipe the material adhering to the template 9, or may remove the material adhering to the template 9 using UV irradiation, wet cleaning, or dry plasma cleaning.

The control unit 200 is a computer apparatus including a central processing unit (CPU) and a memory, and entirely controls the flattening apparatus 100. The control unit 200 comprehensively controls the components of the flattening apparatus 100 to function as a processing unit for performing flattening treatment. In the present exemplary embodiment, the flattening treatment is processing in which the flat surface 10 of the template 9 is brought into contact with the material on the substrate 1 to cause the flat surface 10 to follow a surface profile of the substrate 1 and flatten the material. The flattening treatment is generally performed in units of lot, i.e., for each of a plurality of substrates included in the same lot.

Figure 2A:
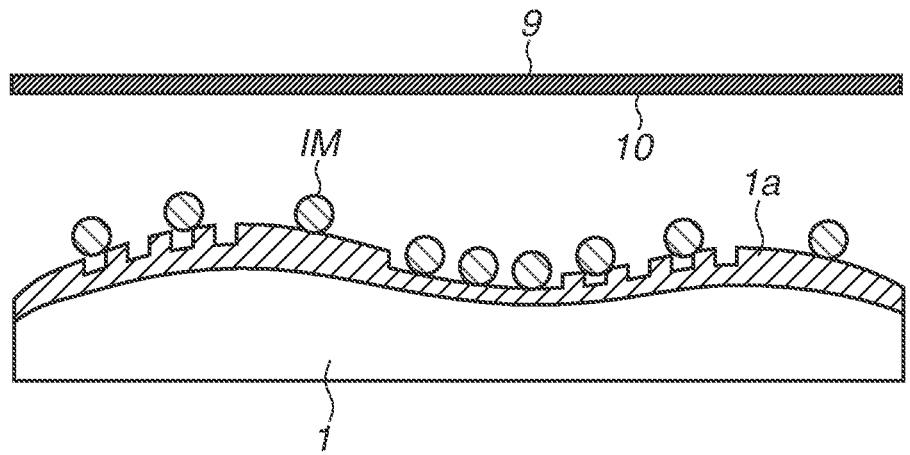
FIGS. 2A, 2B, and 2C are diagrams illustrating flattening treatment.
Figure 2B:
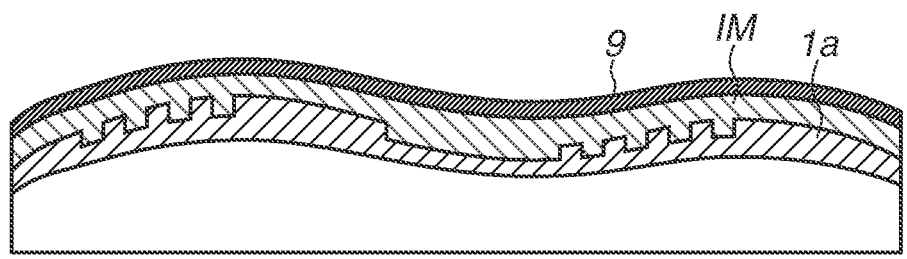
Figure 2C:
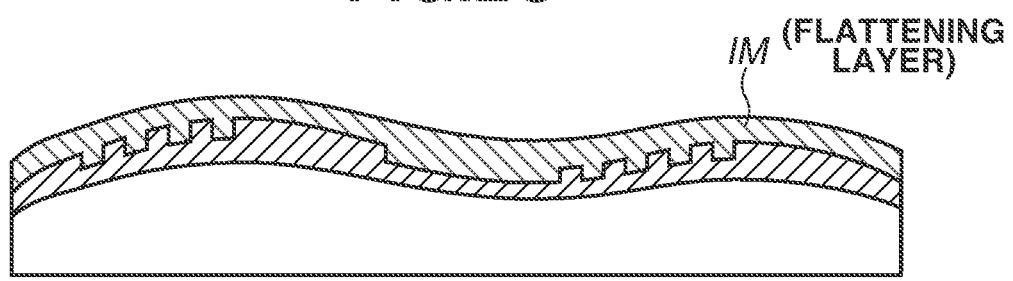

Next, with reference to FIGS. 2A to 2C, the flattening treatment using the flattening apparatus 100 will be described. FIG. 2A illustrates a state where a material IM is arranged on the substrate 1 on which a base pattern 1a is formed. As illustrated in FIG. 2B, the material IM on the substrate 1 and the flat surface 10 of the template 9 are then brought into contact with each other. The template 9 presses the material IM, so that the material IM is spread all over the substrate 1. FIG. 2B illustrates a state where the entire flat surface 10 of the template 9 is in contact with the material IM on the substrate 1, and the flat surface 10 of the template 9 follows the surface profile of the substrate 1. Then, in the state illustrated in FIG. 2B, light is emitted from the light source 20 to the material IM on the substrate 1 through the template 9, to cure the material IM. The template 9 is then separated from the cured material IM on the substrate 1. In this way, a layer (a flattening layer) of the material IM with a uniform thickness is formed on the entire surface of the substrate 1. FIG. 2C illustrates a state where the flattening layer of the material IM is formed on the substrate 1.

Figure 3:
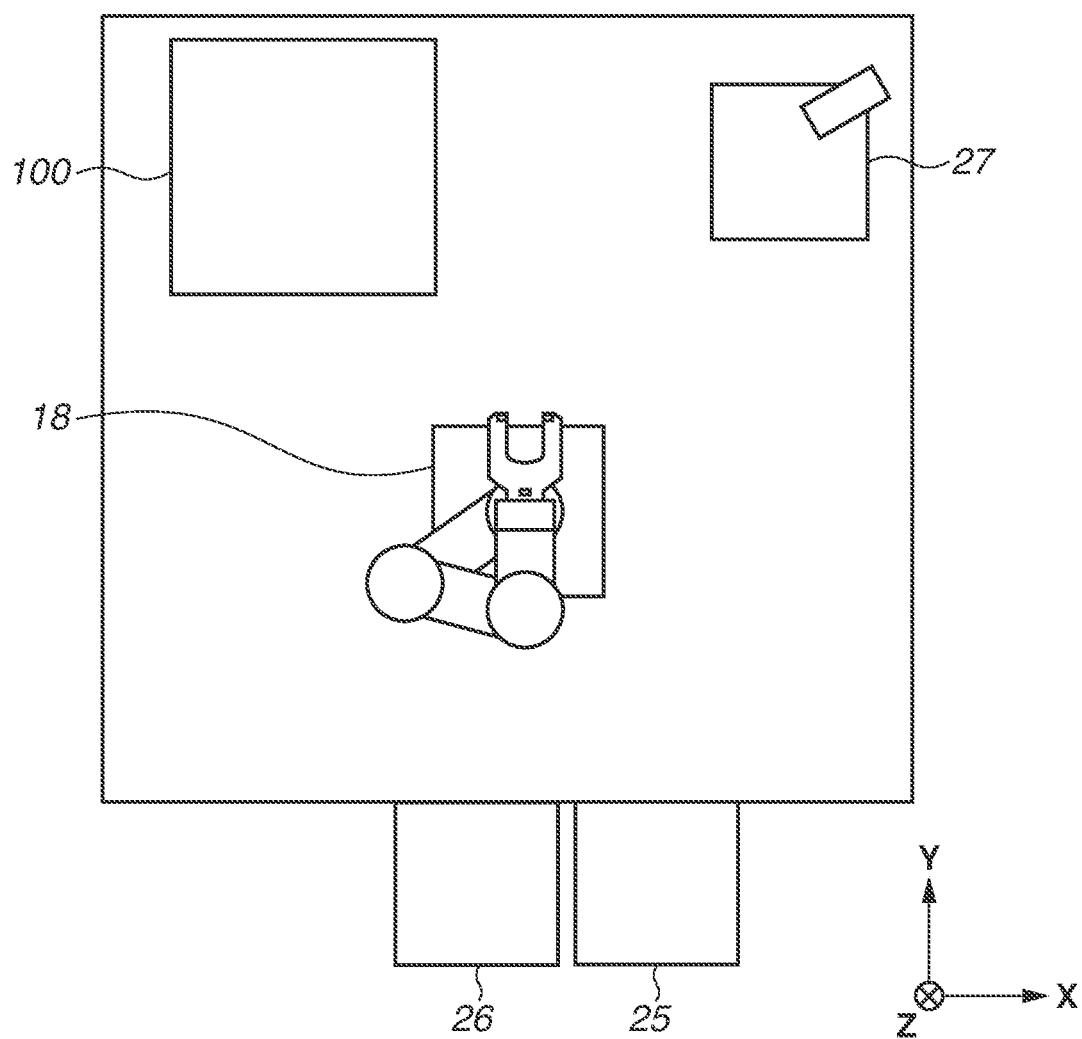
FIG. 3 is a diagram illustrating units related to a substrate conveyance apparatus.

Next, with reference to FIG. 3, units through which the substrate 1 passes in a period after the substrate 1 is carried into a carry-in station 25 and before the substrate 1 is carried to a carry-out station 26 will be described. FIG. 3 illustrates a configuration related to the substrate conveyance apparatus 18. The carry-in station 25 and the carry-out station 26 are interface portions at which the substrate 1 is received and delivered. The substrate conveyance apparatus 18 conveys the substrate 1 between the units illustrated in FIG. 3.

A unit 27 performs pre-treatment for the flattening treatment performed by the flattening apparatus 100, and can be, for example, an apparatus for applying the material onto the substrate 1. The substrate 1 pre-treated by the unit 27 is conveyed to the flattening apparatus 100. Alternatively, the pre-treatment may be performed by a foreign substance inspection unit for inspecting foreign substances adhering to the substrate 1, or a temperature adjustment unit for adjusting a temperature of the substrate 1 to be a predetermined temperature, instead of the unit 27. The apparatus for applying the material onto the substrate 1 may be a unit outside the configuration illustrated in FIG. 3. In this case, the substrate 1 on which the material is applied is carried into the carry-in station 25.

The flattening apparatus 100 performs the flattening treatment for flattening the material on the substrate 1. After the treatment, the substrate 1 is carried to the carry-out station 26 by the substrate conveyance apparatus 18. Alternatively, the substrate 1 may pass through a unit for performing post-treatment before being carried to the carry-out station 26.

Next, an influence caused by evaporation of the material or adhesion of foreign substances will be described. The evaporation of the material can occur because a conveyance step is performed in a period after the material is applied onto the substrate 1 and before the flattening treatment is performed by the flattening apparatus 100. In such a case, a desired accuracy (flatness) may fail to be satisfied in the flattening treatment. The present exemplary embodiment makes it possible to reduce the evaporation of the material applied on the substrate 1. Further, the present exemplary embodiment makes it possible to prevent the adhesion of foreign substances to the substrate 1, thereby making it also possible to suppress accuracy deterioration in the flattening treatment due to the foreign substances.

Figure 4A:
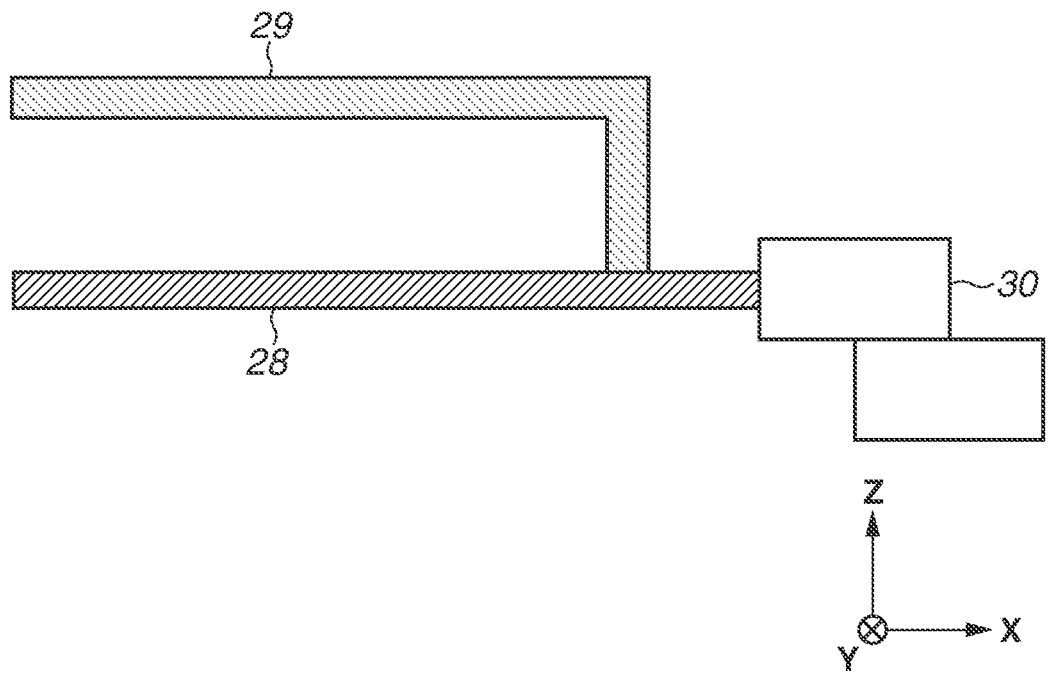
FIGS. 4A and 4B are diagrams each illustrating the substrate conveyance apparatus and a protection member.

Next, a configuration of the substrate conveyance apparatus 18 and a method for conveying the substrate 1 using the substrate conveyance apparatus 18 will be described. FIG. 4A illustrates the configuration of the substrate conveyance apparatus 18. The substrate conveyance apparatus 18 includes a first holding portion 28, a second holding portion 29, and a joint unit 30. The first holding portion 28 is configured to mount the substrate 1 thereon and hold a bottom surface of the substrate 1 using a vacuum chucking unit for attracting the substrate 1 in a vacuum, or an electrostatic chucking unit for attracting the substrate 1 using an electrostatic force. The second holding portion 29 is provided in order to hold a protection member 31 to be described below. The joint unit 30 includes a rotation mechanism, and can convey the substrate 1 to each of the units. For high-accuracy driving, the substrate conveyance apparatus 18 may include a linear motor, an interferometer for position measurement, or an encoder.

Figure 4B:
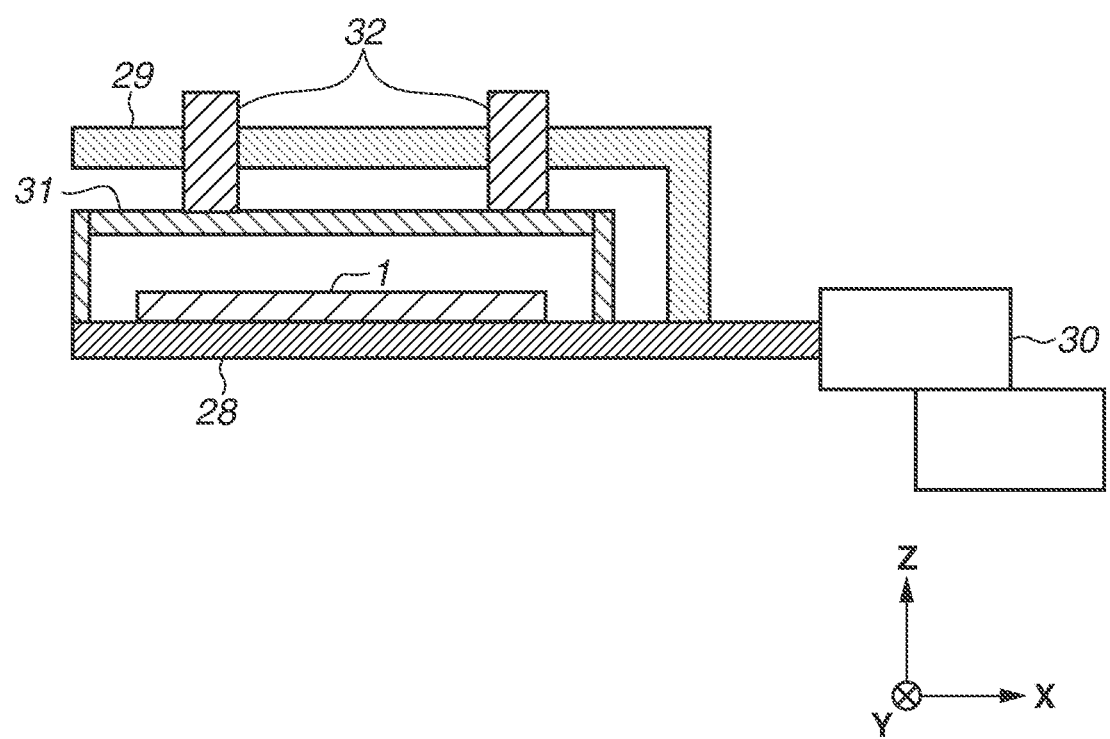

FIG. 4B illustrates a state where the substrate conveyance apparatus 18 conveys the substrate 1. Above an upper surface of the substrate 1, the protection member 31 held by the second holding portion 29 is arranged. Arranging the protection member 31 near the substrate 1 enables suppression of evaporation of the material applied on the substrate 1. Further, the adhesion of foreign substances to the substrate 1 can be reduced. The protection member 31 is arranged so as to cover the upper surface of the substrate 1. As illustrated in FIG. 4B, the protection member 31 is desirably arranged to cover side surfaces of the substrate 1 as well.

Holding and receiving portions 32 are provided on the protection member 31 so that the protection member 31 can be held by the second holding portion 29 provided above a surface of the protection member 31 opposite to a surface thereof facing the substrate 1. Each of the holding and receiving portions 32 is provided with, for example, a space in which the second holding portion 29 is insertable. The second holding portion 29 may be provided with, like the first holding portion 28, a vacuum chucking unit or an electrostatic chucking unit. A plurality of the holding and receiving portions 32 can be provided.

Now, how much a lower surface of the protection member 31 (a surface facing the substrate 1) is brought close to the upper surface of the substrate 1 (the surface facing the protection member 31) in order to reduce the evaporation of the material and the adhesion of foreign substances will be described. In general, viscosity of a fluid is generated depending on a distance from a boundary surface with a solid object. An influence of the viscosity occurs in an extremely narrow area near the boundary surface, and an influence of the viscosity hardly occurs in an area far from the boundary surface. The substrate conveyance apparatus 18 according to the present exemplary embodiment provides a space in which the viscosity of a fluid is generated between the substrate 1 and the protection member 31 by arranging the substrate 1 and the protection member 31 close to each other.

The Hagen-Poiseuille flow equation is known as a steady laminar flow solution of a fluid having a viscosity property flowing through a round pipe. The plane Poiseuille flow equation is obtained by deforming the Hagen-Poiseuille flow equation to express a flow speed of a fluid sandwiched between two stationary parallel flat plates. The plane Poiseuille flow equation expresses that the flow speed is slow at positions near the flat plates and the flow speed is fast at a position far from the flat plates. In other words, the plane Poiseuille flow equation indicates that as a distance between the two parallel flat plates reduces, the flow speed in a space therebetween becomes slower and the fluid flowing therebetween becomes difficult to move. Similarly, in the present exemplary embodiment, by setting a distance between the upper surface of the substrate 1 and the lower surface of the protection member 31 to be, for example, 2 mm or less, an effect of reducing entry of gas from the side surfaces can be expected. Thus, it is possible to reduce the adhesion of foreign substances to the substrate 1. Further, according to the plane Poiseuille flow equation, the effect described above can be enhanced by further reducing the distance between the upper surface of the substrate 1 and the lower surface of the protection member 31. The viscosity property varies depending on the type of gas, and thus it is desirable to set an optimal distance between the upper surface of the substrate 1 and the lower surface of the protection member 31 as appropriate. Further, because contact between the substrate 1 and the protection member 31 affects the material on the substrate 1, it is desirable not to bring the substrate 1 and the protection member 31 into contact with each other.

Moreover, a ventilation hole is provided in the protection member 31, and an ambient gas is blown from the ventilation hole so that a space between the protection member 31 and the substrate 1 has a positive pressure with respect to outside air. In this way, it is possible to enhance the effect of reducing the inflow of foreign substances.

The evaporation of the material on the substrate 1 can also be reduced by arranging the substrate 1 and the protection member 31 close to each other. Making the distance between the upper surface of the substrate 1 and the lower surface of the protection member 31 small is less likely to cause inflow and outflow of gas to and from the space. Accordingly, it is possible to keep an amount of saturated vapor of the material in the space, and suppress the evaporation of the material. Because the property such as the amount of saturated vapor varies depending on the type of material, it is desirable to set an optimal distance between the upper surface of the substrate 1 and the lower surface of the protection member 31 as appropriate.

In the present exemplary embodiment, the protection member 31 is held by the second holding portion 29 on the side of the surface of the protection member 31 opposite to the substrate 1. If the protection member 31 is held by the second holding portion 29 on the side of the surface of the protection member 31 facing the substrate 1, the second holding portion 29 is arranged between the substrate 1 and the protection member 31. In this case, it is not possible to arrange the protection member 31 close enough to the substrate 1. Thus, there is a possibility that the effect according to the present exemplary embodiment may be reduced. Further, in a case where an area near the protection member 31 is held by the second holding portion 29 so that the second holding portion 29 is not arranged between the substrate 1 and the protection member 31, there is a possibility that the protection member 31 may be distorted. If the protection member 31 is distorted in a state where the protection member 31 and the substrate 1 are close to each other, there is a possibility that the protection member 31 and the material on the substrate 1 may come into contact with each other. In the present exemplary embodiment, since the second holding portion 29 holds the protection member 31 on the side of the surface of the protection member 31 opposite to the surface thereof facing the substrate 1, it is possible to appropriately set the positions of the holding and receiving portions 32 so as not to cause the distortion of the protection member 31.

Further, the present exemplary embodiment is advantageous in that the dust that can be generated due to the contact between the second holding portion 29 and the holding and receiving portions 32 can be prevented from adhering to the substrate 1, compared with a case where the holding and receiving portions 32 are provided on the surface of the protection member 31 facing the substrate 1.

For example, a light-transmitting material (e.g., quartz) can be used for the protection member 31. In a case where such a material is used, substrate processing that can be performed in non-contact with the upper surface of the substrate 1, such as various kinds of measurements using light, can be performed while the protection member 31 is kept arranged. Further, applying an electrostatic force to the protection member 31 to attract foreign substances makes it possible to prevent foreign substances from adhering to the substrate 1.

Next, with reference to FIGS. 5A to 5D, a procedure up to the conveyance of the substrate 1 on which the material is applied, from the unit 27 (a first apparatus) to the flattening apparatus 100 (a second apparatus) using the substrate conveyance apparatus 18 will be described. FIG. 5A illustrates a state where the substrate 1 is placed on a stage 33 of the unit 27, and a holding portion 34 of the unit 27 holds a holding and receiving portion 32a to hold the protection member 31.

As illustrated in FIG. 5B, a protruding portion 35 is protruded from a placement surface of the stage 33 (a surface on which the substrate 1 is placed) to raise the substrate 1. At this time, the protruding portion 35 raises the substrate 1 in such a manner that the substrate 1 does not come into contact with the protection member 31. Instead of protruding the protruding portion 35, a groove in which the first holding portion 28 is insertable may be formed in the stage 33 of the unit 27.

Next, as illustrated in FIG. 5C, the first holding portion 28 is inserted in a space below the substrate 1, and the second holding portion 29 is inserted in a space provided in the holding and receiving portion 32b. In FIGS. 5A to 5D, each of the holding and receiving portions 32a and 32b is illustrated as if being divided into an upper part and a lower part for the purpose of description. Each of the holding and receiving portions 32a and 32b may be provided with, for example, a through-hole or may have a U-shape so that the second holding portion 29 can be inserted therein.

Next, when the first holding portion 28 and the second holding portion 29 are raised from the position illustrated in FIG. 5C to a position illustrated in FIG. 5D, the first holding portion 28 holds the substrate 1, and the second holding portion 29 holds the holding and receiving portion 32b to hold the protection member 31. A series of steps illustrated in FIG. 5A to 5D is referred to as a first step.

At this time, it is desirable to determine the distance between the first holding portion 28 and the second holding portion 29 so that the transfer of the substrate 1 and the transfer of the protection member 31 can be performed in parallel (or simultaneously). More specifically, in the state illustrated in FIG. 5C, it is desirable to determine the distance between the first holding portion 28 and the second holding portion 29 so that the distance between the upper surface of the first holding portion 28 and the lower surface of the substrate 1 and the distance between the upper surface of the second holding portion 29 and the lower surface of the holding and receiving portion 32b are equal to each other. Simultaneous transfer of the substrate 1 and the protection member 31 is advantageous in that the substrate 1 and the protection member 31 can be transferred from the unit 27 to the substrate conveyance apparatus 18 with the distance between the substrate 1 and the protection member 31 unchanged.

Next, the substrate 1 is conveyed to the flattening apparatus 100 (the second apparatus) (which is referred to as a second step). Then, the substrate 1 is transferred to the substrate stage 3 of the flattening apparatus 100 using a procedure opposite to the procedure described above (which is referred to as a third step). Through the first to third steps, the conveyance of the substrate 1 to the flattening apparatus 100 is completed. The size of the protection member 31 is desirably almost equal to or larger than the size of the substrate 1.

As described above, it is possible to reduce the evaporation of the material applied on the substrate 1 by conveying the substrate 1 in a state where the protection member 31 is brought close to the substrate 1. Further, the adhesion of foreign substances to the substrate 1 can be reduced.

In the present exemplary embodiment, a template having a flat surface with no asperity pattern is used as the template 9, but the present exemplary embodiment may be applied to an imprint apparatus using a template having an asperity pattern for circuit pattern transfer. The present exemplary embodiment can be applied to a molding apparatus for molding a material on a substrate using a template. Further, the present exemplary embodiment can be applied to an exposure apparatus, a drawing apparatus using an electron beam, or other industrial apparatuses for conveying a substrate.

<Article Manufacturing Method>

Next, a manufacturing method for an article (e.g., a semiconductor integrated circuit (IC) element, a liquid crystal display element, a color filter, or a microelectromechanical system (MEMS)) using the above-described flattening apparatus 100 will be described as a second exemplary embodiment. The manufacturing method includes a step of bringing a material applied on a substrate (e.g., a wafer or a glass substrate) and a template into contact with each other to flatten the material using the above-described flattening apparatus 100, a step of curing the material, and a step of separating the composition and the template from each other. Through these steps, a flattening film is formed on the substrate. Then, an article is manufactured by performing processing such as pattern formation on the substrate with the flattening film formed thereon using a lithography apparatus and then performing processing on the processed substrate using any other known processing step.

A manufacturing method for an article (e.g., an electric circuit element, an optical element, an MEMS, a recording element, a sensor, or a template) using an imprint apparatus will be described. The pattern of the cured material formed by the imprint apparatus is used permanently in at least a part of the article or used temporarily at the time of manufacturing the article. Examples of the electric circuit element include a volatile or nonvolatile semiconductor memory such as a dynamic random access memory (DRAM), a static RAM (SRAM), a flash memory, and a magnetic RAM (MRAM), and a semiconductor device such as a large-scale integration (LSI) device, a charge-coupled device (CCD), an image sensor, and a Field Programmable Gate Array (FPGA). Examples of the template include a mold for imprinting.

The pattern of the cured material is directly used as at least a part of components of the above-described article, or temporarily used as a resist mask. In the processing step of the substrate, the resist mask is removed after etching or ion implantation. A post-treatment step for performing post-treatment of the substrate includes oxidation, film formation, vapor deposition, doping, flattening, etching, resist separation, dicing, bonding, and packaging.

Now, with reference to FIGS. 6A to 6F, the article manufacturing method using the imprint apparatus will be described.

Figure 6A:
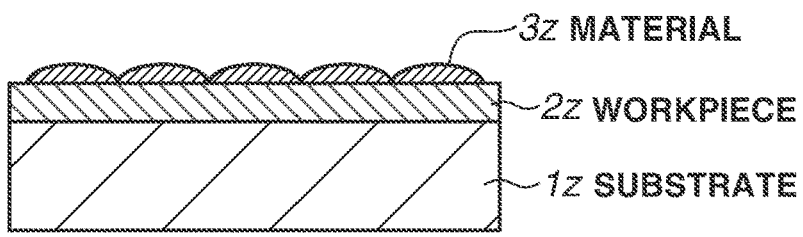
FIGS. 6A to 6F are diagrams illustrating an article manufacturing method.

As illustrated in FIG. 6A, a substrate 1z, such as a silicon wafer, having a surface on which a workpiece 2z such as an insulator is formed is prepared, and then a material 3z is applied on a surface of the workpiece 2z using an inkjet method or the like. FIG. 6A illustrates a state where the material 3z in a plurality of droplets is applied on the substrate 1z.

Figure 6B:
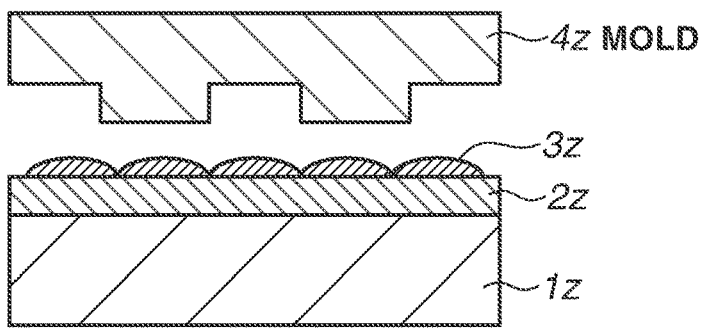
Figure 6C:
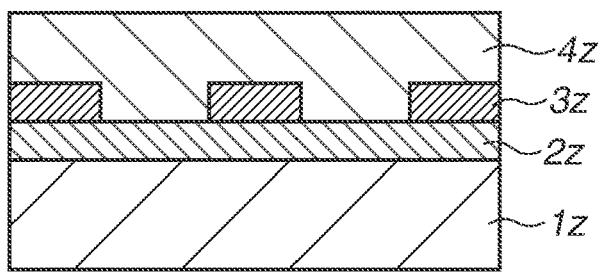

As illustrated in FIG. 6B, a side of a mold 4z for imprinting on which an asperity pattern is formed is oriented toward the material 3z on the substrate 1z to face the material 3z. As illustrated in FIG. 6C, the substrate 1z on which the material 3z is applied and the mold 4z are brought into contact with each other, and a pressure is applied thereto. A gap between the mold 4z and the workpiece 2z is filled with the material 3z. The material 3z in this state is cured by being irradiated with light as curing energy through the mold 4z.

Figure 6D:
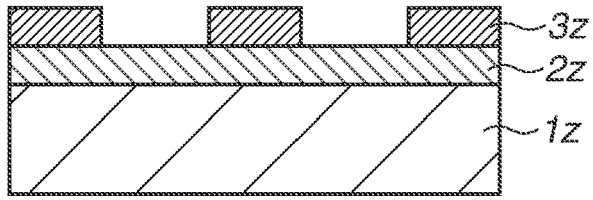

As illustrated in FIG. 6D, when the mold 4z and the substrate 1z are separated from each other after the material 3z is cured, a pattern of the cured material 3z is formed on the substrate 1z, and a molded substrate with the material 3z molded can be obtained. The pattern of the cured material 3z has a shape in which projections of the cured material 3z correspond to depressions of the mold 4z and depressions of the cured material 3z correspond to projections of the mold 4z. In other words, the asperity pattern of the mold 4z is transferred to the material 3z.

Figure 6E:
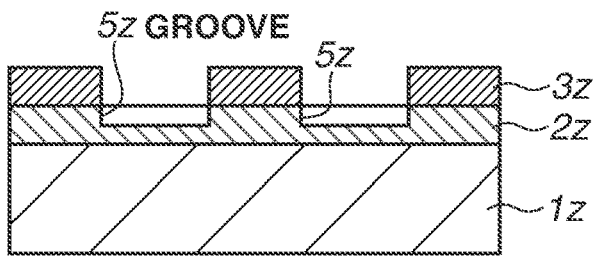
Figure 6F:
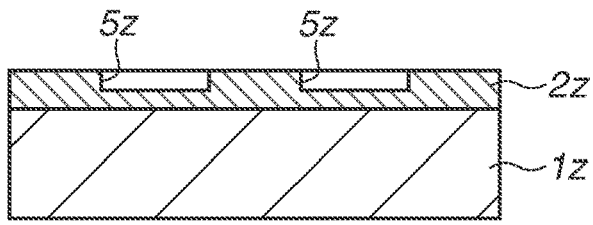

As illustrated in FIG. 6E, when etching is performed using the pattern of the cured material 3z as an anti-etching mask, portions of the workpiece 2z where there is no cured material or a thin cured material remains are removed from the surface of the workpiece 2z to form grooves 5z. As illustrated in FIG. 6F, when the pattern of the cured material 3z is removed, the processed substrate 1z where the grooves 5z are formed on the surface of the workpiece 2z can be obtained. An article can be manufactured from the processed substrate 1z. In the present exemplary embodiment, the pattern of the cured material 3z is removed, but the pattern of the cured material 3z may not be removed and used after the processing, for example, as an interlayer insulation film included in the semiconductor element or the like, i.e., as a component of the article. The article manufacturing method according to the present exemplary embodiment is advantageous in at least one of performance, quality, productivity, and production cost of the article, compared with the conventional method.

While the exemplary embodiments according to the present disclosure have been described above, the present disclosure is not limited to the above-described exemplary embodiments, and can be modified and changed in various manners within the scope of the present disclosure.

According to the exemplary embodiments of the present disclosure, a substrate conveyance method advantageous in reducing the evaporation of the material applied on the substrate can be provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-165612, filed Oct. 7, 2021, which is hereby incorporated by reference herein in its entirety.

What is claimed is:

1. A substrate conveyance method for conveying a substrate, which is placed on a first apparatus and on which a material is applied, to a second apparatus different from the first apparatus using a substrate conveyance apparatus including a first holding portion configured to hold the substrate and a second holding portion configured to hold a protection member for protecting an upper surface of the substrate, the substrate conveyance method comprising:
   transferring, as a first step, the substrate from a placement surface of the first apparatus to the substrate conveyance apparatus;
   conveying, as a second step, the substrate from the first apparatus to the second apparatus; and
   transferring, as a third step, the substrate from the first holding portion to the second apparatus,
   wherein, in the first step, raising the first holding portion in a state where the first holding portion is inserted in a space under the substrate causes the first holding portion to hold the substrate, and causes the second holding portion to hold the protection member by holding a holding and receiving portion provided on a surface of the protection member opposite to a surface of the protection member facing the substrate.

2. The substrate conveyance method according to claim 1, wherein the holding and receiving portion is provided with a space in which the second holding portion is to be inserted.

3. The substrate conveyance method according to claim 2, wherein the holding and receiving portion is provided with a through-hole.

4. The substrate conveyance method according to claim 1, wherein, in the first step, the first apparatus protrudes a protruding portion from a stage on which the substrate is placed, to raise the substrate so as to provide a space between the placement surface and the substrate in which the first holding portion is insertable.

5. The substrate conveyance method according to claim 1, wherein, in the first apparatus, a groove in which the first holding portion is insertable is formed in a stage on which the substrate is placed.

6. The substrate conveyance method according to claim 1, wherein, in the second step, the upper surface of the substrate and a lower surface of the protection member are not in contact with each other, and a distance between the upper surface of the substrate and the lower surface of the protection member is 2 millimeters (mm) or less.

7. A molding method comprising:
   conveying a substrate, which is placed on a first apparatus and on which a material is applied, to a molding apparatus by using a substrate conveyance method for conveying the substrate to a second apparatus different from the first apparatus using a substrate conveyance apparatus including a first holding portion configured to hold the substrate and a second holding portion configured to hold a protection member for protecting an upper surface of the substrate,
   wherein the substrate conveyance method includes:
   transferring, as a first step, the substrate from a placement surface of the first apparatus to the substrate conveyance apparatus,
   conveying, as a second step, the substrate from the first apparatus to the second apparatus, and
   transferring, as a third step, the substrate from the first holding portion to the second apparatus,
   wherein, in the first step, raising the first holding portion in a state where the first holding portion is inserted in a space under the substrate causes the first holding portion to hold the substrate, and causes the second holding portion to hold the protection member by holding a holding and receiving portion provided on a surface of the protection member opposite to a surface of the protection member facing the substrate; and bringing a template of the molding apparatus and the material applied on the substrate into contact with each other to mold the material.

8. The molding method according to claim 7, wherein the molding apparatus is a flattening apparatus configured to form a flattening film of the material on the substrate by bringing the template having a flat surface and the material into contact with each other.

9. The molding method according to claim 7, wherein the molding apparatus is an imprint apparatus configured to form an asperity pattern of the material on the substrate by bringing the template having an asperity pattern and the material into contact with each other.

10. An article manufacturing method comprising:
conveying a substrate, which is placed on a first apparatus and on which a material is applied, to a molding apparatus by using a substrate conveyance method for conveying the substrate to a second apparatus different from the first apparatus using a substrate conveyance apparatus including a first holding portion configured to hold the substrate and a second holding portion configured to hold a protection member for protecting an upper surface of the substrate,
wherein the substrate conveyance method includes:
transferring, as a first step, the substrate from a placement surface of the first apparatus to the substrate conveyance apparatus,
conveying, as a second step, the substrate from the first apparatus to the second apparatus, and
transferring, as a third step, the substrate from the first holding portion to the second apparatus;
obtaining a molded substrate by bringing a template of the molding apparatus and the material applied on the substrate into contact with each other to mold the material;
obtaining a processed substrate by processing the molded substrate; and
manufacturing an article from the processed substrate,
wherein, in the first step of the substrate conveyance method, raising the first holding portion in a state where the first holding portion is inserted in a space under the substrate causes the first holding portion to hold the substrate, and causes the second holding portion to hold the protection member by holding a holding and receiving portion provided on a surface of the protection member opposite to a surface of the protection member facing the substrate.

11. An article manufacturing method comprising:
conveying a substrate, which is placed on a first apparatus and on which a material is applied, to a flattening apparatus by using a substrate conveyance method for conveying the substrate to a second apparatus different from the first apparatus using a substrate conveyance apparatus including a first holding portion configured to hold the substrate and a second holding portion configured to hold a protection member for protecting an upper surface of the substrate,
wherein the substrate conveyance method includes:
transferring, as a first step, the substrate from a placement surface of the first apparatus to the substrate conveyance apparatus,
conveying, as a second step, the substrate from the first apparatus to the second apparatus, and
transferring, as a third step, the substrate from the first holding portion to the second apparatus;
forming a flattening film on the substrate using the flattening apparatus;
obtaining a processed substrate by processing the substrate on which the flattening film is formed; and
manufacturing an article from the processed substrate,
wherein, in the first step of the substrate conveyance method, raising the first holding portion in a state where the first holding portion is inserted in a space under the substrate causes the first holding portion to hold the substrate, and causes the second holding portion to hold the protection member by holding a holding and receiving portion provided on a surface of the protection member opposite to a surface of the protection member facing the substrate.

* * * * *